United States Patent [19]

Fettweis

[11] 4,061,905
[45] Dec. 6, 1977

[54] FILTER HAVING FREQUENCY-DEPENDENT TRANSMISSION PROPERTIES FOR ELECTRIC ANALOG SIGNALS

[75] Inventor: Alfred Fettweis, Bochum, Germany

[73] Assignee: Siemens Aktiengesellschaft, Berlin & Munich, Germany

[21] Appl. No.: 672,884

[22] Filed: Apr. 2, 1976

Related U.S. Application Data

[60] Division of Ser. No. 402,348, Oct. 1, 1973, Pat. No. 3,967,099, which is a continuation of Ser. No. 148,577, June 1, 1971, abandoned.

[30] Foreign Application Priority Data

June 3, 1970 Germany .............................. 2027303

[51] Int. Cl.² .......................... G06F 15/34; H03H 7/10
[52] U.S. Cl. .................................. 364/724; 333/70 R
[58] Field of Search ............. 235/152, 156; 333/70 R; 328/165, 167

[56] References Cited

U.S. PATENT DOCUMENTS

| 3,599,108 | 8/1971 | Gardner | 333/70 T X |
|---|---|---|---|
| 3,619,586 | 11/1971 | Hoff, Jr. | 235/156 |
| 3,794,936 | 2/1974 | Poschenrieder | 333/70 R X |

Primary Examiner—David H. Malzahn
Attorney, Agent, or Firm—Hill, Gross, Van Santen, Steadman, Chiara & Simpson

[57] ABSTRACT

In one illustrative embodiment, a filter circuit for discrete signals is provided corresponding in filter function to an analog ladder structure containing inductive and capacitive components. The reactive components of the analog filter structure are realized in the filter circuit as one-port and two-port elements having time delay, while nonreactive components of the analog filter are realized as time-delay-free one-port and plural-port elements. Interface means connect the port elements together in a configuration corresponding to the configuration of the analog ladder structure, with sets of adder and multiplier means of the interface circuitry which couple successive sets of the port elements to each other being correlated with the connective relationship (whether series, series-parallel or parallel) between the corresponding components or branches of the analog ladder structure and with the parameters of the analog components, so that the filter circuit essentially simulates the analog ladder structure in its filter characteristics.

13 Claims, 55 Drawing Figures

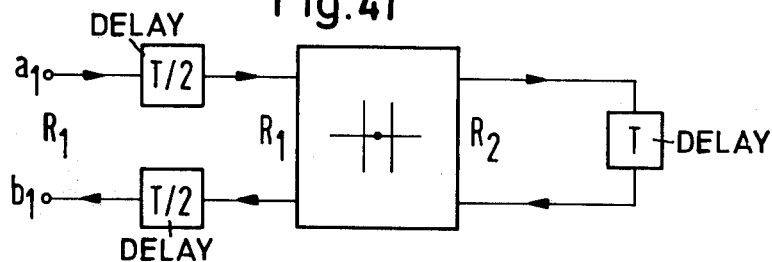
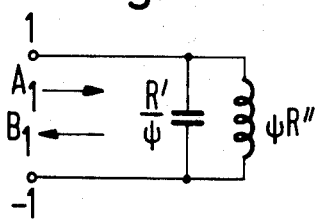
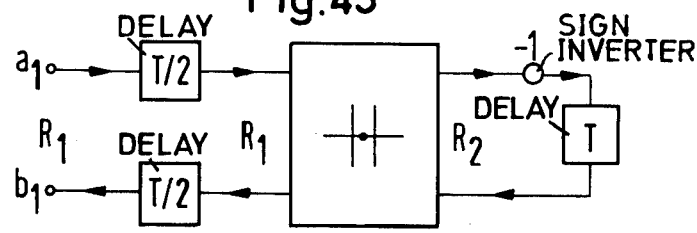
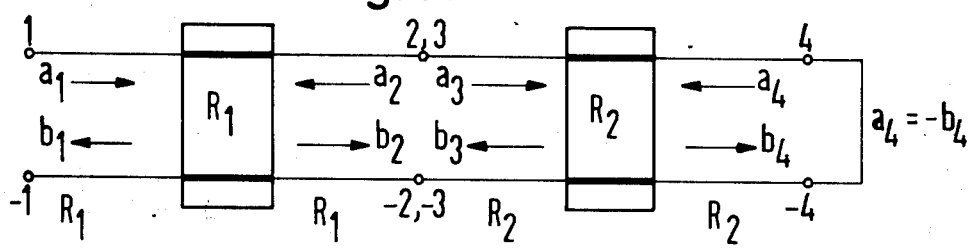
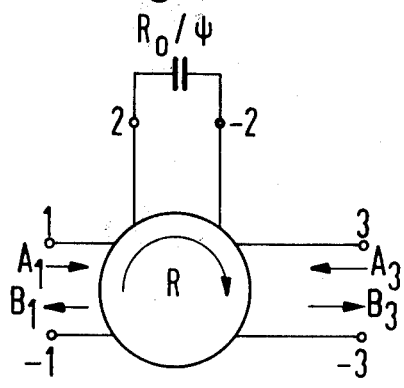
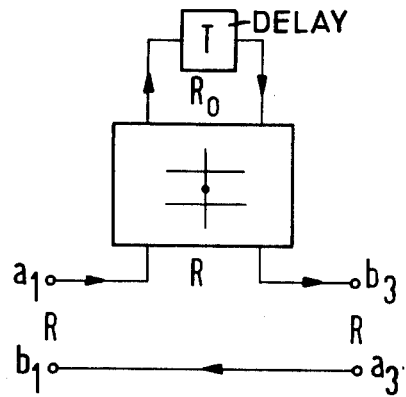

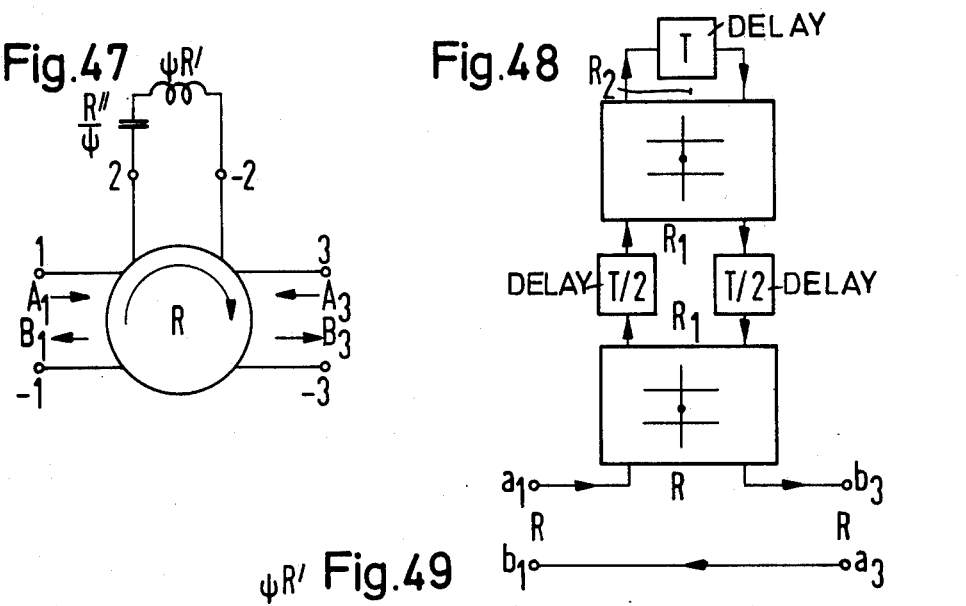
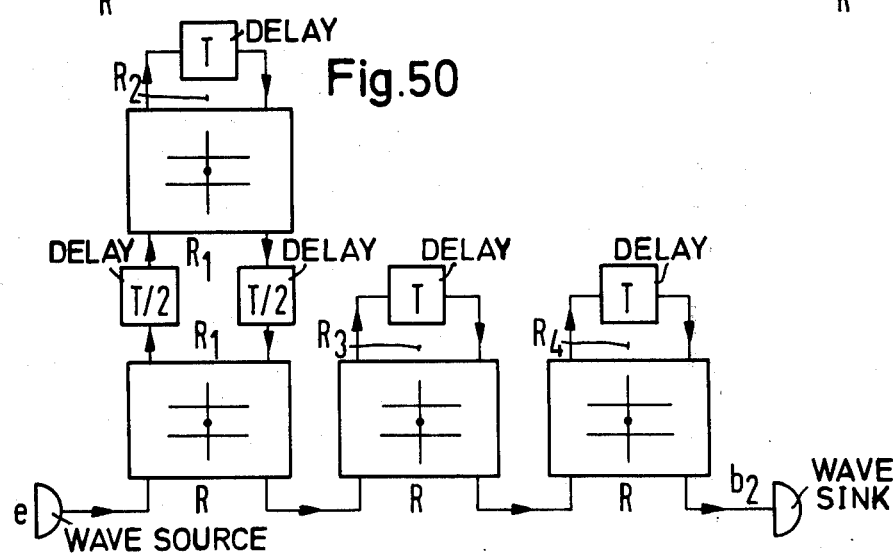

FILTER HAVING FREQUENCY-DEPENDENT TRANSMISSION PROPERTIES FOR ELECTRIC ANALOG SIGNALS

CROSS-REFERENCE TO RELATED APPLICATIONS

The present application is a division of parent application U.S. Ser. No. 402,348, filed Oct. 1, 1973 (now U.S. Pat. No. 3,967,099 issued June 29, 1976). Such parent application is in turn a continuation of my earlier application U.S. Ser. No. 148,577 filed June 1, 1971 (now abandoned).

SUMMARY OF THE INVENTION

The invention relates to a filter. More particularly, my invention relates to a filter having frequency-dependent transmission properties for electric analog signals. Such electric analog signals are in digital form, for example, in the form of PAM, PCM or pulse delta modulation signals. In this context, PAM signal form means that the signal is present in the form of sampling pulses of the analog signal, the information content to be processed, being provided by the amplitude of said pulses. PCM signal form means that the information content of the individual samples is expressed by a code word which is structured according to the principles of pulse code modulation. Pulse delta modulation form in this context means that the signal consists of a binary pulse sequence which transmits the changes in the analog signal sampling values. Mixed forms of these modulations, such as delta PCM are also possible and are included in the consideration of the invention.

It is known that the transmission properties of filters are very sensitive against variations of the coefficients of their transfer function. Although for LC filters this fact only represents a computational problem, since the sensitivity to element variations is rather small for the usual ladder type filters, it amounts to a realization problem in the design of digital filters.

Digital filters have been manufactured with structures whose element or multiplier values may be determined immediately from the required transfer function. An obvious advantage of such a procedure is that it does not require involved realizability theories or lengthy numerical computations, as is the case for the operation parameter synthesis or insertion loss design of conventional LC filters. This is counteracted by the disadvantage that these digital filter structures have a very high sensitivity of their transfer properties to element variations. For a digital realization, this does not only imply a deviation of the actual frequency characteristic from the wanted one, due to coefficient truncation, but also a certain noise due to roundoff accumulation.

The usual way to overcome the aforedescribed difficulty is to first factorize the given transfer function and to realize the filter accordingly as a simple cascade of first and second order sections. It may be wondered, however, whether this is the only solution to the problem, that is, whether there are other types of structures which also reduce the tolerance sensitivity, possibly by offering advantages not obtainable from the simple cascading principle. In particular, it may be interesting in obtaining for digital filters the good stopband insensitivity of ladder structures combined with the good passband insensitivity which resistance terminated LC filters are known to have, due to the fact that their effective loss or transducer loss can never become negative.

Structures of the desired type for digital filters actually do exist. In particular, it is possible to design digital filters according to structures which are closely related to those used for the realization of so-called unit element filters. Since filters of the unit element type may be built in such a way that they fulfill all the aforementioned requirements, this is also true for the corresponding digital filters. The theory of unit element filters is well-known and is similar to the theory of classical LC filters. Gyrators and circulators may be built in the circuits to be described with the same ease as reciprocal elements and there are no restrictions by any desideratum for structures using only grounded unit elements.

It is the object of my invention to reduce the tolerance difficulties which exist with the circuits described above, at least to a tolerable or satisfactory degree. In the last analysis this amounts to keeping to a minimum the number of the multiplier stages required in the filter, which sometimes is also called a computer filter. The reason is that each multiplication brings about an increase in the number of bits, relative to the result in each case. If it is desired to avoid multipliers with economically unjustifiable numbers of bits, it is necessary to shorten or round off the results, which in the last analysis means a reduction in the accuracy of the result obtained.

An object of the invention is to provide a filter with frequency-dependent transmission properties for electric analog signals having tolerance difficulties reduced to a satisfactory degree.

An object of the invention is to provide a filter with frequency-dependent transmission properties for electric analog signals having a minimum number of multiplier stages.

An object of the invention is to provide a filter with frequency-dependent transmission properties for electric analog signals which is economical, reliable, efficient and effective in operation.

An object of the invention is to provide a filter with frequency-dependent transmission properties for electric analog signals which has a substantially reduced number of bits which must be used for the computation coefficients, compared to known filters.

Another object of the invention is to provide a filter with frequency-dependent transmission properties for electric analog signals which may be realized in the same manner and with the same ease as reciprocal elements and without constraints against using only structures with grounded unit elements.

Another object of the invention is to provide a filter with frequency-dependent transmission properties for electric analog signals which has a tolerance sensitivity substantially lower than that of known circuits.

Another object of the invention is to provide a filter with frequency-dependent transmission properties for electric analog signals having the high stopband insensitivity of ladder filters and the high passband insensitivity of resistance-terminated LC filters.

Another object of the invention is to provide a filter with frequency-dependent transmission properties for electric analog signals having a structure very closely related to that of a unit element filter.

In accordance with my invention, the aforedescribed problem is solved in a filter with frequency-dependent transmission properties for electric analog signals which exist in digital form by the provision that the basic filter circuit corresponds to a conventional LC circuit for analog signals, preferably a ladder network, that the reactive two-terminal elements of the analog filter circuit comprising inductance and/or capacitance are embodied as one-ports with delay, and line elements as two-ports with delay, preferably using sampling techniques, that the nonreactive two-terminal elements of the analog filter circuit, which comprise an open-circuit, short-circuit, resistance or source without or with resistance, are embodied as one-ports without delay, and the non-reactive multiport elements, which are a transformer, gyrator and circulator, are embodied as multiports without delay, preferably also using sampling techniques, and that the one-ports and multiports are suitably connected together as a basic filter circuit via adapters which have a configuration for each associated set of adder and multiplier means correlated with the connective relationship (whether series, series-parallel or parallel) and with the parameters of the components of the analog filter circuit corresponding to the set of port elements being connected thereby. In this sense the adapters operate on the discrete signals being interchanged with the sets of port elements making up the basic filter circuit to provide port resistance matching between the individual one-ports and multiports.

In accordance with the invention, a filter having frequency-dependent transmission properties for electric analog signals in a digital form has a basic filter circuit corresponding to an LC circuit ladder network comprising reactive two-terminal elements of one of the group consisting of inductance and capacitance formed as one-ports having a time delay and line elements formed as two-ports having a time delay and utilizing sampling techniques. Non-reactive two-terminal elements of one of the group consisting of an open circuit, a short-circuit, a resistance, a resistance source without resistance and a resistance source with resistance are formed as time delay-free one-ports and non-reactive multiport elements of one of the group consisting of a transformer, a gyrator and a circulator are formed as time delay-free multiports and utilize sampling techniques. Adapter means connect the one-ports and the multiports together for providing port resistance matching between the individual one-ports and multiports.

A one-port having a time delay and functioning as an inductance may comprise a time delay and a sign inverter connected in series with the time delay.

A one-port having a time delay and functioning as a capacitance may comprise a time delay.

A two-port functioning as a line element may comprise two transmission paths of opposite direction of transmission and a pair of time delays each providing one half the total required time delay and each connected in a corresponding one of the transmission paths.

A time delay-free one-port functioning as a resistance may comprise a wave sink.

A time delay-free one-port functioning as an open circuit may comprise a one-port for reflecting waves supplied thereto at the same phase.

A time delay-free one-port functioning as a short-circuit may comprise a one-port having a sign inverter for waves reflected therein.

A delay-free multiport functioning as a gyrator may comprise a pair of transmission paths of opposite direction of transmission and a sign inverter connected in one of the transmission paths for reflected waves.

A delay-free multiport functioning as a circulator may comprise a multiport having at least three ports each having terminals and connecting means connecting the terminals of the different ports in series in a manner whereby a terminal for supplying waves to one port is connected to a terminal of a next port from which waves are derived.

A delay-free multiport functioning as a transformer having a transformation ratio of $-1/1$ may comprise a two-port having a pair of transmission paths of opposite direction of transmission, one for incident waves and the other for reflected waves, and a pair of sign inverters each connected in a corresponding one of the transmission paths.

A delay-free multiport functioning as a transformer having a transformation ratio of $1/n$ may comprise a pair of multiports each having a sign inverter in one transmission direction and a two-port adapter having port resistances corresponding to the required voltage transformation ratio, the sign inverters being connected in cascade via the adapter.

The adapter may comprise a two-port adapter, each port having an input connection and an output connection, a first adder, a sign inverter connected in series with the first adder with the series connection being connected in common between the input connections, the first adder having one input connected to the input connection of one of the ports via the sign inverter, another input connected to the input connection of the other of the ports and an output, a second adder having one input connected to the input connection of one of the ports, another input and an output, a third adder having one input connected to the input connection of the other of the ports, another input and an output, a multiplier having an input connected to the output of the first adder and an output connected in common to the other input of each of the second and third adders, the output connection of one of the ports being connected to the output of one of the second and third adders, and the output connection of the other of the ports being connected to the output of the other of the second and third adders.

The adapter may comprise a circuit having at least three ports and $n-1$ multipliers connected in parallel, where $n$ is the number of ports.

The adapter may comprise a circuit having at least three ports and $n-2$ multipliers connected in series, where $n$ is the number of ports.

The starting point in my invention is a completely new way of viewing the computer filters which permits the utilization of circuits the tolerance sensitivity of which is substantially lower than that of the circuits used heretofore. These are, in particular, the resistance-terminated so-called ladder networks, which are in wide use for filters with lumped inductances and capacitances. The high stopband insensitivity of ladder filters and the high passband insensitivity of resistance-terminated LC filters, due to the well known fact that their insertion loss can never become negative may therefore be attained for digital filters or computer filters. The invention permits the design of digital filters according to structures which are very closely related to those of so-called unit element filters. Since filters of the last-mentioned type may be manufactured in such a manner that they meet all of the aforedescribed requirements, the same applies also to the corresponding digital filters. The theory of the unit element filters is well known and similar to the theory of the classical LC filters.

A special advantage of the filter circuit technique according to the invention is also that gyrators and circulators may also be realized in the same manner and with the same ease as reciprocal elements and that there are no constraints against, for example, using only structures with grounded unit elements, as was common practice prior to my invention. Furthermore, there is the substantial advantage that the computer filter of the invention has a substantially reduced number of bits which must be used for the computation coefficients, in comparison with known computer filters.

The invention is hereinafter explained in greater detail with the aid of a derivation of the general theory and of examples of implementation. The detailed circuit design, particularly the delay and storage devices, adders and multipliers utilized, are not discussed further, since they are known per se, for example, from the reference The Special Issue on Digital Filters, *IEEE Transactions on Audio and Electroacoustics*, volume AU-16, number 3, Sept. 1968. The examples of implementation refer to the drawings.

In order that the invention may be readily carried into effect, it will now be described with reference to the accompanying drawings.

BRIEF DESCRIPTION OF THE DRAWINGS

FIG. 14a is a circuit diagram of an ideal transformer having a ratio $-1/1$;

FIG. 14b is a wave flow diagram of FIG. 14a;

FIG. 41 is a wave flow diagram of FIG. 39;

FIG. 42 is a circuit diagram of a parallel resonant circuit;

FIG. 43 is a wave flow diagram of FIG. 42;

FIG. 44 is an equivalent circuit of FIG. 42 utilizing two unit elements;

FIG. 45 is a circuit diagram of a unilateral first order allpass filter section;

FIG. 46 is a wave flow diagram of a two-port of FIG. 45;

FIG. 47 is a circuit diagram of a unilateral second order allpass filter section;

FIG. 48 is a wave flow diagram of a two-port of FIG. 47;

FIG. 49 is a circuit diagram of a terminated unilateral allpass filter;

FIG. 50 is a wave flow diagram of FIG. 49;

DESCRIPTION OF THE PREFERRED EMBODIMENTS

Figure 1:
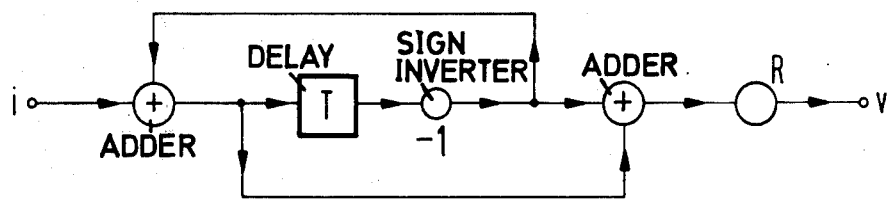
FIG. 1 is a current-voltage flow diagram of an inductance in the $\psi$ domain.

Where required, the port resistance is indicated under the lower port terminal or in its vicinity.

The transfer function $H(p)$ of an ordinary LC ladder filter is a rational function of the complex frequency $p$ and corresponds to a single differential equation between the input variable $x$ and the output variable $y$. Instead of using an LC structure, it is possible in theory to realize this differential equation directly in an analog computer, in which case the coefficients of $H(p)$ would each correspond to a multiplication by a constant. Actually, such a procedure would be completely impractical since for good filters, the coefficients of $H(p)$ must be known with extreme accuracy in order to determine with only mild accuracy the zeros and poles of H(p), and thus the actual transfer behavior. Despite this difficulty, LC filters, and even quite complicated ones, are known. This implies that in the usual LC ladder structures, the sensitivities to element variations are very much smaller. Mathematically, this is related to the fact that a ladder structure cannot fully be described by a single differential equation, but only by a system of differential equations whose detailed structure not only corresponds to the overall input/output performance but also to the precise topology of the actual network. The low tolerance sensitivity of terminated ladder structures thus implies that the sensitivity to variations in the coefficients of the aforementioned system of differential equations is very much lower than the sensitivity to variations of the coefficients of the overall differential equation obtained after elimination of all internal variables. These peculiarities are, of course, also at the origin of the fact that filter computations often have to be carried out with a very high number of digits in order to end up with a number of digits for the elements which is just within the reach of technological possibilities.

The situation is very similar for digital filters, except that the aforedescribed numerical problem then corresponds to a realization problem due to the aforementioned phenomena of coefficient truncation and round-off accumulation. The transfer function H may then be written as a rational function of the variable $z = e^{pT}$, where $F = 1/T$ is the rate of operation of the filter. This transfer function corresponds to a single difference equation between the input and output variables. Here too, however, a considerable improvement may be obtained by breaking up the single differential equation into an appropriate system of differential equations. One manner of doing this corresponds to the usual factorization of H and the subsequent realization by means of a simple cascade of low order sections. The method hereinafter described corresponds to trying to find a system of differential equations which in some sense imitates a classical terminated ladder filter structure. The analogy with the aforedescribed classical filter design problem shows that a solution thus obtained must certainly represent a considerable improvement. It would be interesting to know whether even better solutions exist. In any case, due to their high relative cost, the number of multipliers has to be kept as low as possible, while adders may be used more generously.

In order to guarantee that a structure may be realized as digital filter, the following requirement must always be fulfilled. Every feedback loop contained in the signal or wave flow diagram describing the structure must comprise at least one delay element, that is, it may not be free from delay. It may be easily verified that this rule is fulfilled for any known digital filter structures. Violation of the rule would imply that it becomes impossible to fine a sequence in which the various computations may be carried out.

The complex frequency $\psi$ is utilized as a frequency variable for establishing the analogy with the theory of unit element filters. The complex frequency $\psi$ is defined by $$\psi = \tanh\left(\frac{pT}{2}\right) = \frac{1 - e^{-pT}}{1 + e^{-pT}} \quad (1.1)$$

which is also used, for example, in the theory of resonant transfer circuits. For $p = j\omega$, it may thus be stated that $$\psi = j\phi, \quad \phi = \tan(\omega T/2) \quad (1.2)$$

The choice of $\psi$ as the frequency variable seems to be the only one appropriate to the problem. It has an immediate consequence which is hereinafter briefly discussed.

If the usual voltages and currents are utilized as signals in the flow diagrams, it is impossible to observe the aforementioned rule concerning feedback loops. In order to illustrate this, an arbitrary element, such as, for example, an inductance, is considered. The equation to be realized is $V = \psi RI$ where R is a positive constant. Due to Equation (1.1) this would require for the corresponding difference equation $$v(nT) + v[(n-1)T] = \{i(nT) - i[(n-1)T]\} R \quad (1.3)$$

which shows that the computation of $v$ at the instant $t = nT$ requires not only the knowledge of $v$ and $i$ at the previous sampling instant, but also at the present one. Hence, any flow diagram representation of Equation (1.3), such as the one shown in FIG. 1, contains a delay-free path leading from the input to the output. The same is true for the current-voltage or voltage-current flow diagrams of all other elements. Thus, the interconnection of elements inevitably leads to delay-free feedback loops, thus making any physical implementation impossible.

This dilemma can be avoided by basing all signal flow diagrams not on voltages and currents, but on wave quantities. In fact, voltage waves or current waves may be used indifferently. A description by voltage waves is adopted herein. As briefly described hereinafter under the heading "Simple Change of Reference Resistance", the use of power waves would be less appropriate since this would lead to a larger number of required multipliers. If waves are used, a wave flow diagram is referred to, rather than a signal flow diagram. Also, the filters described herein may appropriately be called wave digital filters. A wave flow diagram which satisfies the aforedescribed rule is called realizable; otherwise it is called unrealizable.

As hereinafter illustrated, wave digital filters usually require two separate sequences of time instants at which the filter is operative. These two sequences are shifted by a time interval T/2 with respect to one another, as is also the case of the digital filters described by Fjällbrant in "Digital Filters With a Number of Shift Sequences in Each Pulse Repetition Interval" IEEE International Synposium on Circuit Theory, December 8, 9, 10, 1969 in San Francisco. In any case, it will often be necessary to provide difference relations without assuming that one of the pulses of the time sequence occurs at $t = 0$. In the discussion of elements and sources in the next section, a general time variable $t$ is therefore used. That is, no reference is made to any particular instants at which pulses occur.

ELEMENTS AND SOURCES

Herein are established the wave flow diagrams of the various elements and sources to be used. Wherever possible, the required wave quantities are defined by means of a port resistance equal to the resistance constant R occurring in the definition of the element or source under consideration. This way, the wave equations do not contain R at all, anymore. The consequences arising when the elements and the source have to be interconnected in order to obtain the required filter diagram are hereinafter illustrated.

REACTIVE ELEMENTS

Inductance

Figure 2:
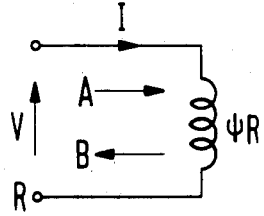
FIG. 2 is a circuit diagram of an inductance of an impedance $\psi R$.

The steady state voltage-current relation to be realized is, as shown in FIG. 2, $$V = \psi RI \tag{2.1}$$

where R is a positive constant. If Equation (1.1) is utilized, Equation (2.1) may be $$B = -(1/z)A \tag{2.2}$$

wherein z is defined, as usual, as $$z = e^{pT}, \tag{2.3}$$

and wherein $$A = V+RI \text{ and } B = V-RI \tag{2.4a and 2.4b}$$

are the incident and the reflected waves, respectively. The instantaneous values $a = a(t)$ and $b = b(t)$ of these waves are related to the instantaneous values of the voltage $v = v(t)$ and the current $i = i(t)$ by $$a = v+Ri \text{ and } b = v-Ri \tag{2.5a and 2.5b}$$

Hence, the differential equation for $a$ and $b$ is $$b(t) = -a(t-T) \tag{2.6}$$

wherein $$a = A e^{pt} \text{ and } b = B e^{pt} \tag{2.7}$$

When A and B are assumed to be constants, the steady state solution of Equation (2.6) is indeed provided by Equation (2.2). The wave flow diagrams corresponding to Equations (2.2) and (2.6) are the wave one-ports shown in FIGS. 3 and 4, respectively. The first one (FIG. 3) comprises a transmittance or transfer function equal to $-1/z$, and the second one (FIG. 4) comprises a delay T connected in series with a sign or polarity inverter.

Figure 3:
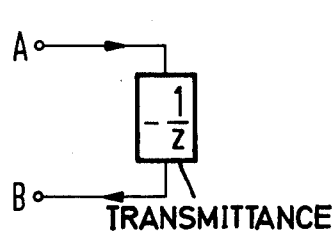
FIG. 3 is a steady state wave flow diagram of a transmittance $-1/z$ of FIG. 2.
Figure 4:
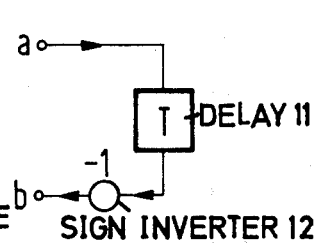
FIG. 4 is an instantaneous wave flow diagram of a delay T and a sign inverter of FIG. 2.

As shown in FIGS. 2, 3 and 4, and especially in FIG. 4, a filter of the invention comprises a one-port having a time delay and functioning as an inductance. The filter of FIG. 4 comprises a time delay 11 having a delay period T and a sign inverter 12 connected in series with the time delay.

Capacitance

Figure 5:
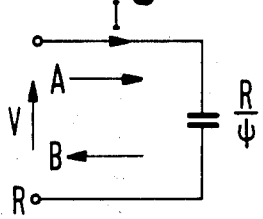
FIG. 5 is a circuit diagram of a capacitance of an impedance $R/\psi$.

The steady state voltage-current relation to be realized is, as shown in FIG. 5, $$V = (R/\psi) I \tag{2.8}$$

wherein R is a positive constant. Utilizing Equations (1.1), (2.3) and (2.4), Equation (2.8) is $$B = (1/z) A. \tag{2.9}$$

Thus, the differential equation for the instantaneous wave quantities defined by Equation (2.5) is $$b(t) = a(t-T) \tag{2.10}$$

Equation (2.10) reduces to Equation (2.9) if Equation (2.7) is utilized. The wave flow diagrams are the wave one-ports shown in FIGS. 6 and 7. They comprise a transmittance $1/z$ and a delay T, respectively.

Figure 6:
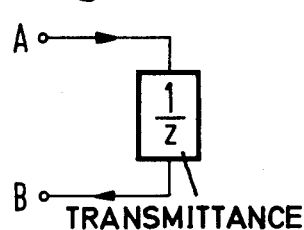
FIG. 6 is a steady state wave flow diagram of a transmittance $-1/z$ of FIG. 5.
Figure 7:
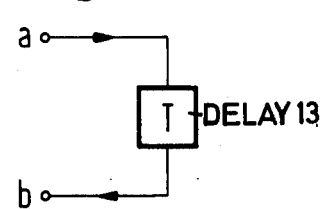
FIG. 7 is an instantaneous wave flow diagram of a delay T of FIG. 5.

As shown in FIGS. 5, 6 and 7, and especially in FIG. 7, a filter of the invention comprises a one-port having a time delay and functioning as a capacitance. The filter of FIG. 7 comprises a time delay 13 having a delay period T.

Elements With Frequency-Independent Behavior

For reasons of simplicity, all equations relating to elements with frequency-independent behavior are stated for instantaneous quantities only. It is obvious that the corresponding equations for steady state quantities have the same structure.

Resistance

Figure 8:
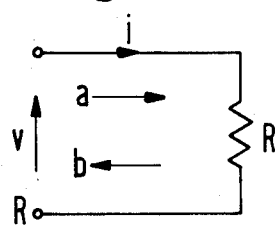
FIG. 8 is a circuit diagram of a resistance R.

The equation to be realized is, as shown in FIG. 8, $$v = Ri$$

that is, utilizing Equation (2.5), $$b = 0 \tag{2.11}$$

Figure 9:
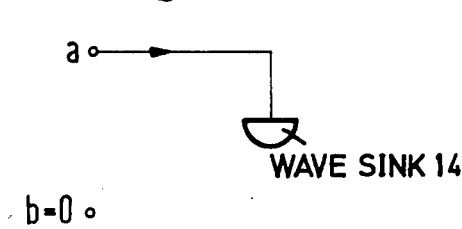
FIG. 9 is a wave flow diagram of a wave sink of FIG. 8.

Thus, the wave flow diagram comprises a wave sink, represented as shown in FIG. 9.

As shown in FIGS. 8 and 9, a filter of the invention comprises a time delay-free one-port functioning as a resistance. The filter of FIG. 8 comprises a wave sink 14.

Open-Circuit

Figure 10:
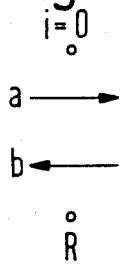
FIG. 10 is a circuit diagram of an open circuit.

In FIG. 10, $i = 0$. Thus, if an arbitrary positive constant R is selected and Equation (2.5) is utilized $$b = a \tag{2.12}$$

Figure 11:
FIG. 11 is a wave flow diagram of FIG. 10.

The wave flow diagram is thus a simple through connection, as shown in FIG. 11.

As shown in FIGS. 10 and 11, a filter of the invention comprises a time delay free one-port functioning as an open circuit. The filter of FIG. 11 comprises a two port for reflecting waves supplied thereto at the same phase.

Short-Circuit

Figure 12:
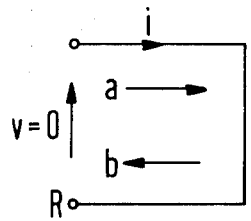
FIG. 12 is a circuit diagram of a short-circuit.

In FIG. 12, $v = 0$. Thus, if an arbitrary positive constant R is selected and Equation (2.5) is utilized, $$b = -a \tag{2.13}$$

Figure 13:
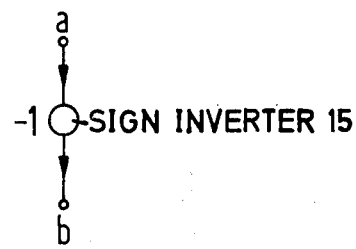
FIG. 13 is a wave flow diagram of FIG. 12.

The wave flow diagram thus comprises a sign inversion, as shown in FIG. 13.

As shown in FIGS. 12 and 13, a filter of the invention comprises a time delay-free one-port functioning as a short-circuit. The filter of FIG. 13 comprises a two-port having a sign inverter 15 for waves reflected therein.

Ideal Transformer of Ratio $-1/1$

Figure 14:
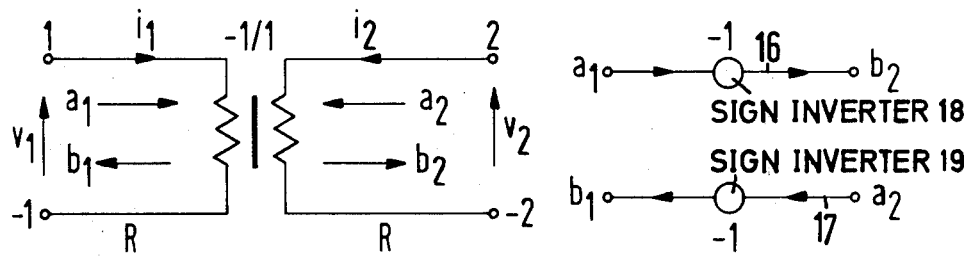

The equations to be realized are, as shown in FIG. 14a, $$i_1 = i_2 \text{ and } v_1 = -v_2 \tag{2.14a and 2.14b}$$

Hence, if an arbitrary positive constant R is selected and the definitions $$a_k = v_b + RI_k, \quad b_k = v_k - RI_k \qquad (2.15a)$$
and
$$(2.15b)$$

$$k = 1, 2 \qquad (2.15c)$$

are utilized, $$b_1 = -a_2 \text{ and } b_2 = -a_1 \qquad (2.16a)$$
and
$$(2.15b)$$

The wave flow diagram is then a wave two-port, as shown in FIG. 14b.

As shown in FIGS. 14a and 14b, a filter of the invention comprises a delay-free multiport functioning as a transformer having a transformation ratio of −1/1. The filter of FIG. 14b comprises a two-port having a pair of transmission paths 16 and 17 of opposite direction of transmission, one for incident waves and the other for reflected waves. Each of a pair of sign inverters 18 and 19 is connected in a corresponding one of the transmission paths 16 and 17.

Gyrator

Figure 15:
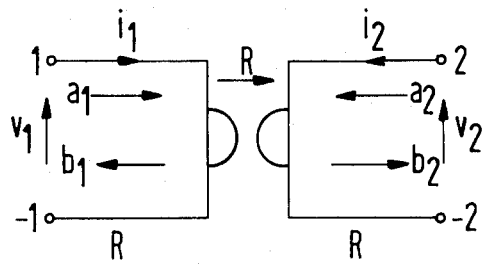
FIG. 15 is a circuit diagram of a gyrator having a gyrator resistance R.

The equations to be realized are, as shown in FIG. 15, $$v_1 = -Ri_2 \text{ and } v_2 = Ri_1 \qquad (2.17a)$$
and
$$(2.17b)$$

wherein the gyration resistance R is a positive constant. When Equations (2.15a), (2.15b) and (2.15c) are utilized, $$b_1 = -a_2 \text{ and } b_2 = a_1 \qquad (2.18a)$$
and
$$(2.18b)$$

Figure 16:
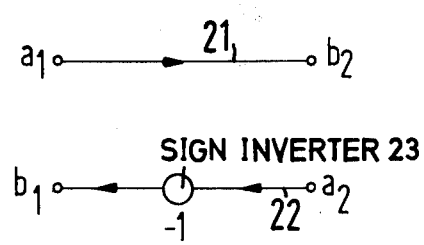
FIG. 16 is a wave flow diagram of FIG. 15.

The corresponding wave two-port is shown in FIG. 16.

As shown in FIGS. 15 and 16, a filter of the invention comprises a delay-free multiport functioning as a gyrator. The filter of FIG. 16 comprises a pair of transmission paths 21 and 22 of opposite direction of transmission. A sign inverter 23 is connected in one of the transmission paths 22 for reflected waves.

Circulator

Figure 17:
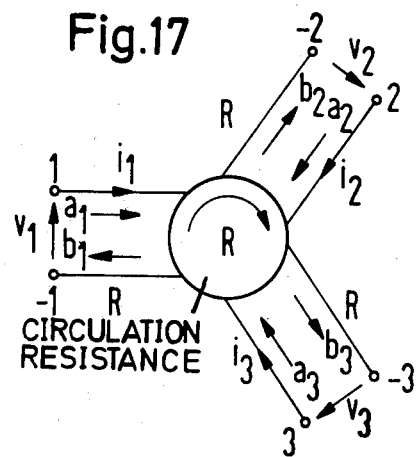
FIG. 17 is a circuit diagram of a three-port circulator having a circulation resistance R.

The three-port circulator is shown in FIG. 17. The three-port circulator has a circulation resistance R which is a positive constant. If Equations (2.15a) and (2.15b), with $k = 1, 2$ and 3, are utilized, $$b_1 = a_3, \ b_2 = a_1, \ b_3 = a_2 \qquad (2.19a, 2.19b \text{ and } 2.19c).$$

Figure 18:
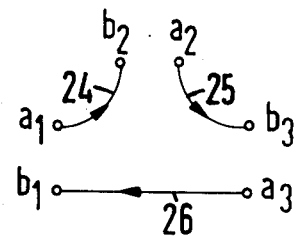
FIG. 18 is a wave flow diagram of FIG. 17.

The wave flow diagram is then the wave three-port shown in FIG. 18.

As shown in FIGS. 17 and 18, a filter of the invention comprises a delay-free multiport functioning as a ciculator. The filter of FIG. 18 comprises a multiport having at least three ports each having terminals $a_1$ and $b_1$, $a_2$ and $b_2$ and $a_3$ and $b_3$, respectively. The terminals of the different ports are connected in series by connectors 24, 25 and 26 in a manner whereby a terminal for supplying waves to one port is connected to a terminal of a next port from which waves are derived. It is obvious this result may easily be extended to n-port circulators, in which case Equations (2.19a), (2.19b) and (2.19c) have to be generalized to $$b_1 = a_n, \ b_2 = a_1, \ \ldots \ b_n = a_{n-1} \qquad (2.20)$$

Unit Element

Figure 19:
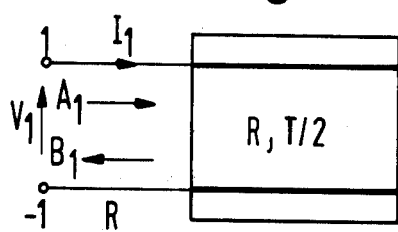
FIG. 19 is a block diagram of a unit element of a delay T/2 and a characteristic resistance R.

The steady state voltage-current relations to be realized are, as shown in FIG. 19, $$B_1 = A_2 e^{-pT/2} \text{ and } B_2 = A_1 e^{-pT/2} \qquad (2.21a)$$
and
$$(2.21b)$$

wherein $$A_k = V_k + RI_k \text{ and } B_k = V_k - RI_k \qquad (2.22a)$$
and
$$(2.22b)$$

$$k = 1, 2 \qquad (2.22c)$$

Hence, the differential equations for the instantaneous waves defined by Equations (2.15a), (2.15b) and (2.15c) are $$b_1(t) = a_2(t-T/2) \text{ and } b_2(t) = a_1(t-T/2); \qquad (2.23a)$$
and
$$(2.23b)$$

with $$a_k = A_k e^{pt} \text{ and } b_k = B_k e^{pt} \qquad (2.24)$$

When $A_k$ and $B_k$ are constants, the steady state solution of Equations (2.23a) and (2.23b) is provided by Equations (2.21a and 2.21b). The instantaneous wave flow diagram is then the wave two-port shown in FIG. 20. The steady state wave flow diagram is similar, but with the delays T/2 replaced by transmittances $z^{-1/2}$.

Figure 20:
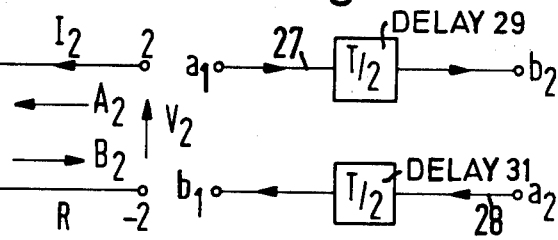
FIG. 20 is a wave flow diagram of FIG. 19.

As shown in FIGS. 19 and 20, a filter of the invention comprises a two-port functioning as a line element. The filter of FIG. 20 comprises two transmission paths 27 and 28 of opposite direction of transmission. A pair of time delays 29 and 31 each provides one half the total required time delay. The time delay 29 is connected in the transmission path 27 and the time delay 31 is connected in the transmission path 28.

The delay T/2 of the unit element is indicated explicitly in the block of FIG. 19. This is omitted, hereinafter.

Sources

Only instantaneous quantities are considered herein, as in "Elements With Frequency — Independent Behavior".

Resistive Source

Figure 21:
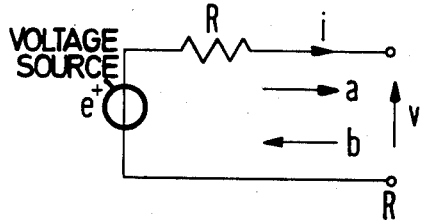
FIG. 21 is a circuit diagram of a source of voltage $e$ in series with a resistance R.

It is sufficient to consider a voltage source of voltage $e = e(t)$ with a series resistance R, as shown in FIG. 21. The equation to be realized is $$e = v + Ri \qquad (2.25)$$

that is, utilizing Equation (2.5), $$a = e \qquad (2.26)$$

Figure 22:
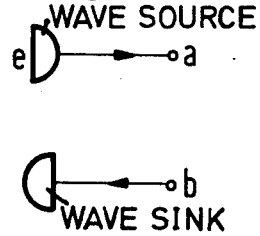
FIG. 22 is a wave flow diagram of FIG. 21.
Figure 23:
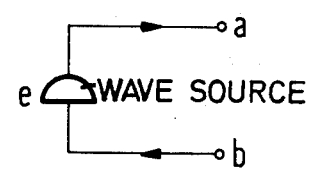
FIG. 23 is an equivalent wave flow diagram of FIG. 21.

Hence, the wave flow diagram is a wave source, indicated as shown in FIGS. 22 and 23.

Figure 24:
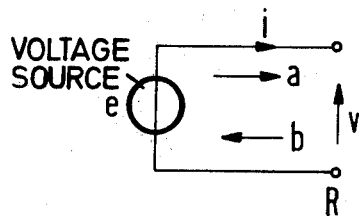
FIG. 24 is a circuit diagram of a source of voltage $e$.

The situation is slightly less simple for a pure voltage source, as shown in FIG. 24. The equation to be realized is $v = e = e(t)$. Hence, if an arbitrary positive constant R is selected and Equation (2.5) is utilized, $$a = 2e - b \quad \quad (b\ 2.27)$$

Figure 25:
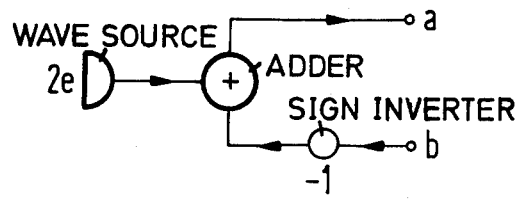
FIG. 25 is a wave flow diagram of FIG. 24.

The corresponding wave flow diagram comprises a wave source $2e$, an adder and a sign inverter, as shown in FIG. 25.

Figure 26:
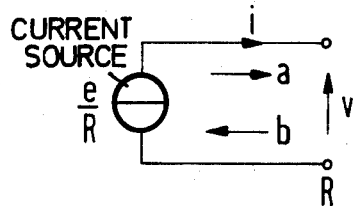
FIG. 26 is a circuit diagram of source of current $e/R$.
Figure 27:
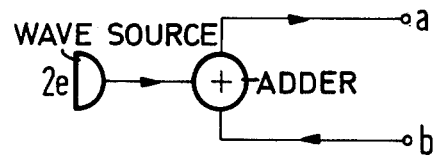
FIG. 27 is a wave flow diagram of FIG. 26.

For a pure current source, as shown in FIG. 26, the following equation is obtained in a similar manner.

$$a = 2e + b \quad \quad (2.28)$$

wherein the intensity of the current source is selected equal to $e/R$. The corresponding wave flow diagram is shown in FIG. 27.

Interconnection of Ports

Circuits are obtained in principle by interconnecting the ports of elements and sources. A difficulty then arises in the wave flow diagram, since in most of the aforedescribed cases, the port resistance R is not arbitrary, but is imposed by the element or source to which the port belongs. Thus, when interconnecting ports, there must be available a possiblity of changing the port resistance. This may be achieved by means of the various adaptors hereinafter described.

Simple Change of Reference Resistance

Consider two ports 1 and 2, having port resistances $R_1$ and $R_2$, respectively. The waves are related to the voltages and currents by $$a_k = v_k + R_k i_k \text{ and } b_k = v_k - R_k i_k \quad \quad \begin{array}{c}(3.1a) \text{ and}\\(3.1b)\end{array}$$

$$k = 1, 2 \quad \quad (3.1c)$$

Figure 28:
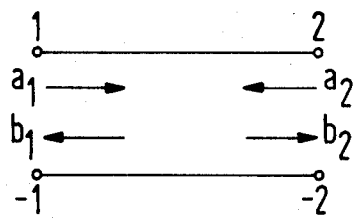
FIG. 28 is a circuit diagram of the interconnection of two-ports having port resistances $R_1$ and $R_2$.

If these ports are simply interconnected, as shown in FIG. 28, $$v_1 = v_2 \text{ and } i_1 = -i_2 \quad \quad \begin{array}{c}(3.2a) \text{ and}\\(3.2b)\end{array}$$

Eliminating $v_k$ and $i_k$ between Equations (3.1a) and 3.1b) and (3.2a) and (3.2b), $$b_1 = a_2 + \alpha(a_2 - a_1) \text{ and } b_2 = a_1 + \alpha(a_2 - a_1) \quad \quad \begin{array}{c}(3.3a) \text{ and}\\(3.3b)\end{array}$$

wherein $$\alpha = (R_1 - R_2)/(R_1 + R_2) \quad \quad (3.4)$$

Figure 29:
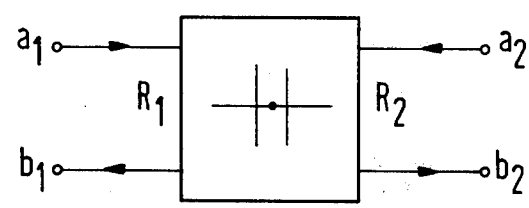
FIG. 29 is a block diagram of the two port adapter of FIG. 28.
Figure 30:
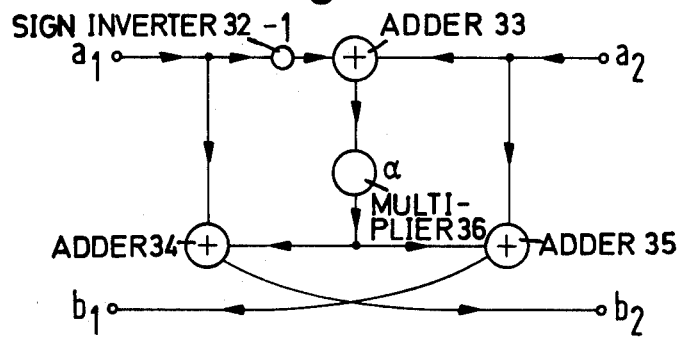
FIG. 30 is a wave flow diagram of the two port adapter of FIG. 29 having one multiplier $\alpha$.

These equations define a wave two-port which is called a two-port adaptor herein. It is represented schematically, as shown in FIG. 29 by the symbols within the block referring to the fact that FIG. 28 corresponds in a sense as well to a parallel as to a series connection (compare FIGS. 33 and 36). According to Equation (3.3), a detailed wave flow diagram corresponding to the two-port adapter of FIG. 28 may be drawn as shown in FIG. 30. The wave flow diagram of FIG. 30 requires only one multiplier, $\alpha$. It contains a path or circuit leading from $a_1$ to $b_1$ and also a path leading from $a_2$ to $b_2$, but no feedback loop. Other equivalent wave flow diagrams may be obtained by presenting Equation (3.3) in equivalent form. Not all of these, however, require only one multiplier.

As shown in FIG. 30, a filter of the invention comprises a two-port adapter. As shown in FIG. 30, each port has an input connection $a_1$ and $a_2$, respectively and an output connection $b_1$ and $b_2$, respectively. A sign inverter 32 connected in series with a first adder 33, with the series connection being connected in common between the input connections $a_1$ and $a_2$. The first adder 33 has one input connected to the input connection $a_1$ of one of the ports via the sign inverter 32 and another input connected to the input connection $a_2$ of the other of the ports. A second adder 34 has one input connected to the input connection $a_1$ of one of the ports. A third adder 35 has one input connected to the input connection $a_2$ of the other of the ports. A multiplier 36 has an input connected to the output of the first adder 33 and an output connected in common to the other input of each of the second and third adders 34 and 35, respectively. The output connection $b_1$ of one of the ports is connected to the output of the third adder 35. The output connection $b_2$ of the other of the ports is connected to the output of the second adder 34.

Equation (3.4) shows that for $R_1 > 0$ and $R_2 > 0$, $|\alpha| < 1$. Vice versa, if the latter inequality is fulfilled, $R_1/R_2 > 0$, as may be seen from $$R_1/R_2 = (1+\alpha)/(1-\alpha) \quad \quad (3.5)$$

This shows that, always, $R_2 > 0$ as soon as $R_1 > 0$ and vice versa.

This connection permits an explanation of the advantage of using voltage or current waves rather than power waves. A general representation of scattering equations such as Equation (3.3) is $$b_1 = \alpha_{11}a_1 + \alpha_{12}a_2 \text{ and } b_2 = \alpha_{21}a_1 + \alpha_{22}a_2 \quad \quad \begin{array}{c}(3.6a) \text{ and}\\(3.6b)\end{array}$$

where the scattering coefficients are related to one another by the linear relations $$-\alpha_{11} = \alpha_{22} = 1 - \alpha_{12} = \alpha_{21} - 1 = \alpha \quad \quad (3.7)$$

If power waves are utilized, equations like Equations (3.6a) and (3.6b) may still be presented, but the scattering coefficients are then related by $$\alpha_{11}^2 + \alpha_{12}^2 = 1,\ \alpha_{12} = \alpha_{21},\ \alpha_{11} = -\alpha_{22} \quad \quad \begin{array}{c}(3.8a),\\(3.8b)\\ \text{and}\\(3.8c)\end{array}$$

Since the first of Equations (3.8a), (3.8b) and (3.8c) is nonlinear, it would thus not be possible to provide a wave flow diagram of Equation (3.5) which would require only one multiplier.

Figure 31:
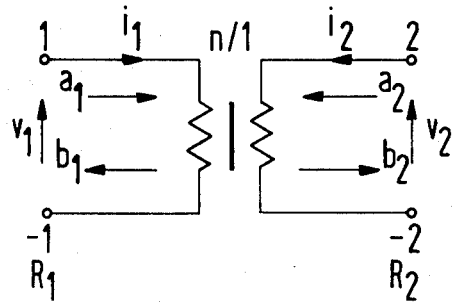
FIG. 31 is a circuit diagram of a transformer having a ratio $n/1 > 0$.
Figure 32:
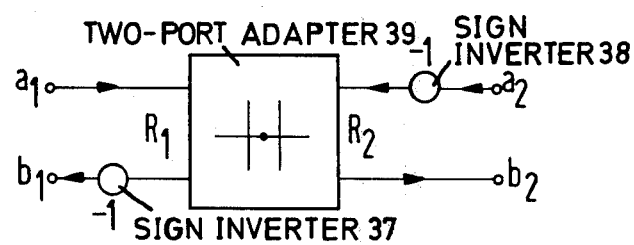
FIG. 32 is a block diagram of the transformer of FIG. 31 wherein $n = R_1/R_2$.

A simple application is the realization of a transformer having a ratio $n/1$, as shown in FIG. 31. IF it were attempted to do this in a direct way, as was hereinbefore done for other elements, two multipliers would have been required. In fact, however, such a transformer can be realized as a cascade of two gyrators having gyration resistances $R_1$ and $R_2$ such that $n = R_1/R_2$. Thus, using the result of FIGS. 15 and 16, the wave flow diagram of FIG. 32 is obtained, wherein one of the resistances $R_1$ and $R_2$ may be chosen arbitrarily. In order to conform with the assumption that $R > 0$ made in connection with FIGS. 15 and 16, it must be presently assumed that $n > 0$. With regard to FIG. 14, however, the corresponding result for $n < 0$ is easily obtained.

As shown in FIGS. 31 and 32, a filter of the invention comprises a delay-free multiport functioning as a transformer having a transformation ratio of $1/n$. The filter of FIG. 32 comprises a pair of multiports $a_1$ and $b_1$ and $a_2$ and $b_2$ each having a sign inverter 37 and 38, respectively, in one transmission direction. A two-port adapter 39 has port resistances corresponding to the required voltage transformation ratio. The sign inverters 37 and 38 are connected in cascade via the adapter 39.

Parallel Connection

A plurality of $n$ ports $1, 2, \ldots, n$. having port resistances $R_1, R_2, \ldots, R_n$, respectively, may be considered. The waves are related to the voltages and currents by Equations (3.1a) and (3.1b), when $$k = 1, 2, \ldots, n$$

Figure 33:
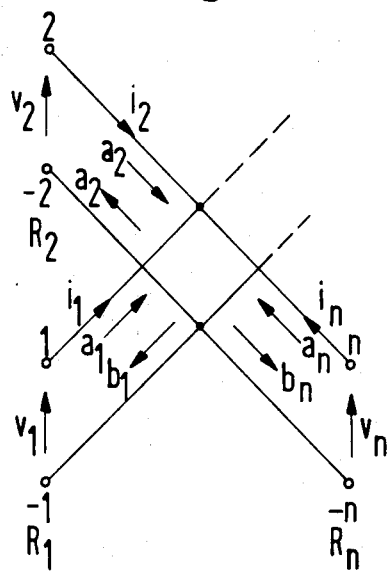
FIG. 33 is a circuit diagram of a parallel connection of n-ports having port resistances $R_1, R_2 \ldots R_n$.

If these ports are connected in parallel, as shown in FIG. 33, $$v_1 = v_2 = \ldots = v_n \text{ and } i_1 + i_2 + \ldots + i_n = 0 \quad \text{(3.9a) and (3.9b)}$$

Eliminating $v_k$ and $i_k$ between Equations (3.1a), (3.1b), (3.9a) and (3.9b), the following equation is provided.

$$b_k = a_o - a_k \text{ and } a_o = \sum_{k=1}^{n} \alpha_k a_k \quad \text{(3.10a) and (3.10b)}$$

wherein $$\alpha_k = 2G_k/(G_1 + G_2 + \ldots + G_n) \text{ and } G_k = 1/R_k \quad \text{(3.11a) and (3.11b)}$$

Figure 34:
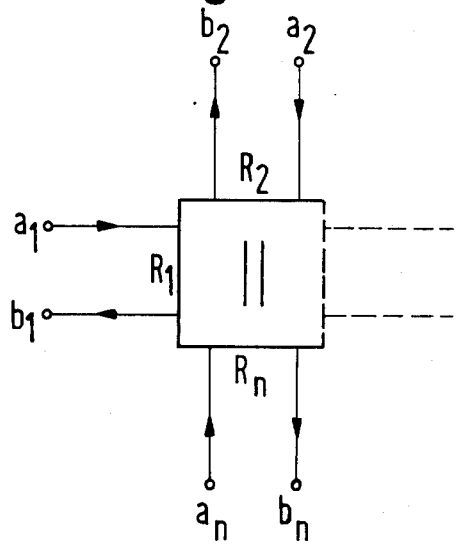
FIG. 34 is a block diagram of the n-port parallel adapter of FIG. 33.

These equations define a wave $n$-port, referred herein as a parallel adapter, or more precisely, an $n$-port parallel adapter. The parallel adapter is schematically indicated, as shown in FIG. 34, by two parallel lines inside of the block, referring to the parallel connection.

Figure 35:
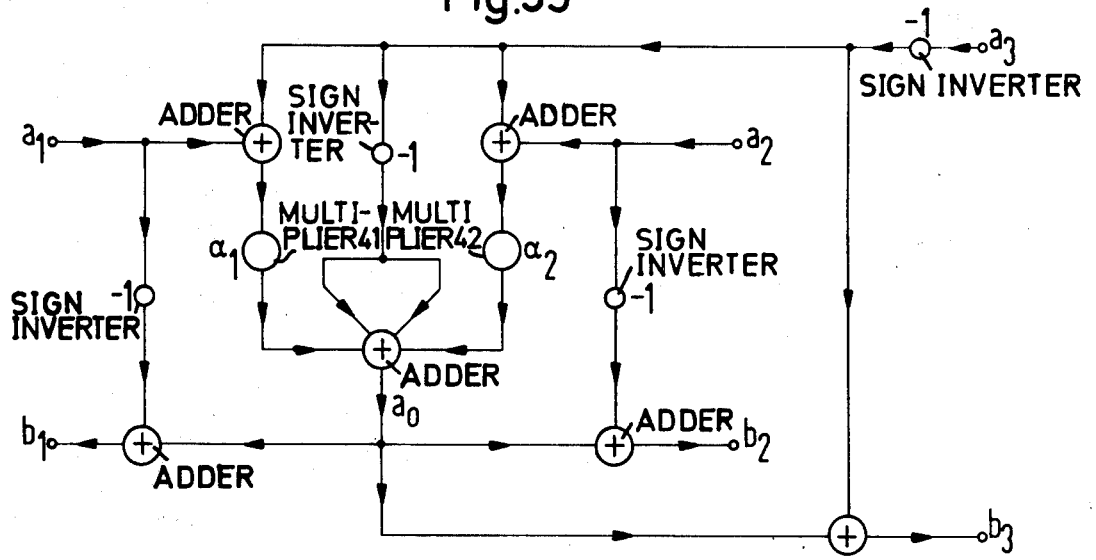
FIG. 35 is a wave flow diagram of a three port parallel adapter in which port 3 is the dependent port.

If Equations (3.10a) and (3.10b) are utilized, $n$ multipliers are required. In fact, $$\alpha_1 + \alpha_2 + \ldots + \alpha_n = 2 \quad (3.12)$$

so that one of the $\alpha_k$ such as, for example, $\alpha_n$, may be eliminated. This permits Equation (3.10b) to be $$a_o = 2a_n + \sum_{k+1}^{n-1} \alpha_k(a_k - a_n) \quad (3.13)$$

thus requiring only $n-1$ multipliers. The port $n$ is then called the dependent port. The number of multipliers may be further reduced if some of the multipliers $\alpha_k$ are equal, that is, if some of the resistors $R_k$ are equal. The factor 2 in Equation (3.13) does not require any special multiplier, since a multiplication by 2 is a very elementary process. As an example, the detailed wave flow diagram for $n=3$ is shown in FIG. 35, in accordance with Equations (3.10a), (3.10b) and (3.13). For every $k = 1,2,3$, it contains a path leading from $a_k$ to $b_k$, but it does not contain any feedback loop. This conclusion remains true for arbitrary values of $n$.

As shown in FIG. 35, a filter of the invention comprises an adapter circuit having at least three ports $a_1$ and $b_1$, $a_2$ and $b_2$ and $a_3$ and $b_3$ and $n-1$ multipliers 41 and 42 connected in parallel, where $n$ is the number of ports.

If the values $G_k$ are specified positive constants, all the multipliers $\alpha_k$ also turn out positive and satisfy Equation (3.12). Vice versa, if all the multipliers $\alpha_k$ and one of the values $G_k$ such as, for example $G_k$, are given, the remaining value $G_k$ may be computed by means of $$G_k/G_k' = \alpha_k/\alpha_k' \quad (3.14)$$

which is easily derived from Equation (3.11a). Thus, if $G_k'$ as well as $\alpha_1, \alpha_2, \ldots, \alpha_{n-1}$ are given positive constants, and if $\alpha_n$, derived via Equation (3.12) is also positive, all the values $G_k$ turn out positive.

If the port $n$ is the dependent port, as assumed, the coefficient $\alpha_n$ is implicitly determined by the remaining coefficient $\alpha_k$ through Equation (3.12). Thus, if the sum of the remaining coefficients $\alpha_k$ is close to 2, that is, if $\alpha_n$ is small, it may be determined in this manner only within a large error. In order to insure the highest possible precision, the port selected as the dependent port should be that whose corresponding $\alpha_k$ is the largest.

Series Connection

Figure 36:
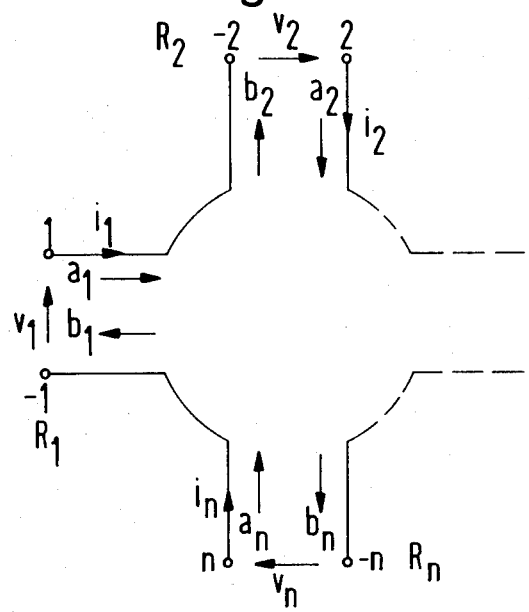
FIG. 36 is a circuit diagram of a series connection of $n$ ports having port resistances $R_1, R_2 \ldots R_n$.

A plurality of $n$ ports may be connected in series, as shown in FIG. 36. Then, $$i_1 = i_2 = \ldots = i_n \text{ and } v_1 + v_2 + \ldots + v_n = 0 \quad \text{(3.15a) and (3.15b)}$$

Eliminating $v_k$ and $i_k$ between Equations (3.1a), (3.1b), (3.15a) and (3.15b), the following equation is provided $$b_k = a_k - \beta_k a_o \text{ and } a_o = \sum_{k=1}^{n} a_k \quad \text{(3.16a) and (3.16b)}$$

wherein $$\beta_k = 2R_k/(R_1 + R_2 + \ldots + R_n) \quad (3.17)$$

Figure 37:
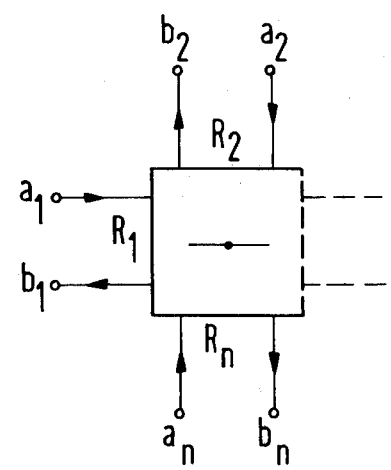
FIG. 37 is a block diagram of the n-port series adapter of FIG. 36.

These equations define a wave $n$-port, which is called a series adapter herein, or more precisely an $n$-port series adapter. The series adapter is schematically indicated, as shown in FIG. 37, by the single line symbol inside of the block referring to the series connection.

If Equations (3.16a) and (3.16b) are utilized, altogether $n$ multipliers are required. In fact, $$\beta_1 + \beta_2 + \ldots + \beta_n = 2 \quad (3.18)$$

so that one of the values $\beta_k$, such as, for example, $\beta_n$, may be eliminated. This may be done, for example, by utilizing Equations (3.16a) and (3.16b) for $k = 1,2, \ldots, n-1$, and then computing $b_n$ by means of the equation derived from Equations (3.16a), (3.16b) and (3.18)

$$b_n = -a_o - \sum_{k=1}^{n-1} b_k \quad (3.19)$$

The port $n$ is then again called the dependent port. The number of multipliers may be further reduced if some of the multipliers $\beta_k$ are equal, that is, if some of the resistors $R_k$ are equal. For the coefficient $\beta_k$, similar considerations apply as for the coefficient $\alpha_k$, hereinbefore described.

Figure 38:
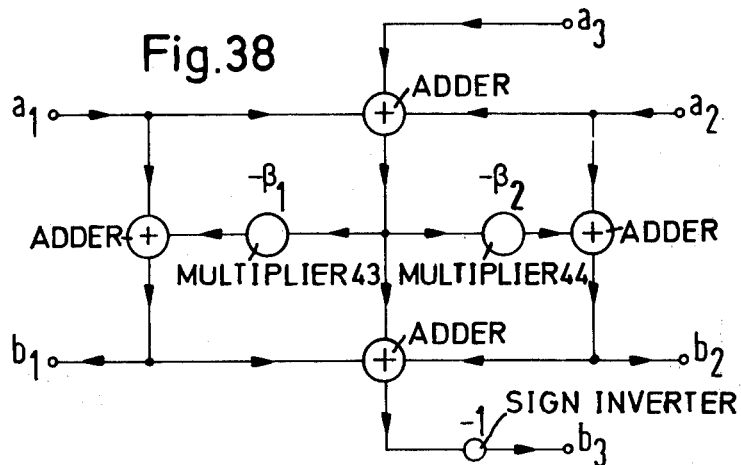
FIG. 38 is a wave flow diagram of a three-port series adapter in which port 3 is the dependent port.

As an example, the detailed wave flow diagram for $n=3$ is shown in FIG. 38, according to Equations (3.16a) and (3.19). For every $k = 1,2,3$, it contains a path or circuit leading from $a_k$ to $b_k$, but it does not contain any feedback loops. These conclusions are also true for arbitrary values of $n$.

As shown in FIG. 38, a filter of the invention comprises an adapter circuit having at least three ports $a_1$ and $b_1$, $a_2$ and $b_2$ and $a_3$ and $b_3$ and $n$-1 multipliers 43 and 44 connected in series, where $n$ is the number of ports.

It may be easily proven that for $n = 2$, the parallel and the series adapters both become equivalent to the adapter described in the section entitled "Simple Change of Reference Resistance".

REALIZATION OF CIRCUITS

General Principles

How various types of elements, sources and adapters may be manufactured to serve as building blocks for the wave flow diagrams to be realized has been hereinbefore described. When interconnecting these building blocks, the following principles must be observed:

1. The building blocks must be interconnected port by port, that is, the two wave terminals of one wave port must be connected to the two wave terminals of precisely one other wave port.
2. For every two wave terminals which are joined together, the two corresponding waves must be compatible, that is, they must flow in the same direction.
3. The resulting wave flow diagram of the aforementioned principle must be realizable.

The first two of these principles, obviously, are relatively easy to comply with. The third one, however, has far reaching consequences. For every port of an adapter there always exists an inner path leading from the incident wave to the corresponding reflected wave. Hence, any of the wave one-ports shown in FIGS. 4, 7, 9 and 23 may be connected to a wave port of an adapter. None of the wave one-ports shown in FIGS. 11, 13, 25 and 27 may be connected to a wave port of an adapter. One of the wave two-ports shown in FIG. 20 may be similarly connected, but not another adapter. Finally, wave two-ports and multiports, such as those of FIGS. 14b, 16 and 18, are conditionally acceptable, that is, they will not by themselves cause the appearance of delay-free feedback loops, but may do so if they are not properly terminated at the remaining port or ports.

It may be concluded that, withing the aforedescribed theory, two consecutive adapters must always be separated in one manner or another by a wave two-port corresponding to a unit element. In order to examine the consequences of this conclusion, the realization of one-port reactances and the realization of reactance two-ports are next considered.

Whereever possible, and in particular in all wave flow diagram, instantaneous wave quantities such as $a_k$ and $b_k$ are utilized exclusively. It is clear that the complex wave amplitudes $A_k$ and $B_k$ may be equally utilized, but then a delay T should be replaced by a transfer function $z^{-1} = e^{-pT}$, and a delay T/2 should be replaced by a transfer function $z^{-\frac{1}{2}}$.

REALIZATION OF REACTANCES

Series Resonant Circuit

Figures 39, 40:
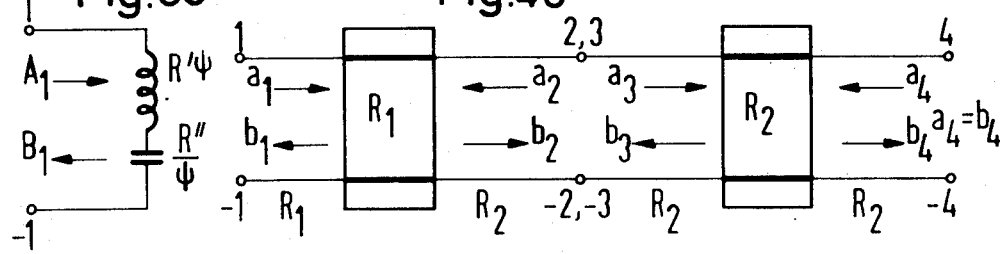
FIG. 39 is a circuit diagram of a series resonant circuit.
FIG. 40 is an equivalent circuit of FIG. 39 utilizing two unit elements.

It is assumed that it is desired to realize the series resonant circuit of FIG. 39. If it forms part of a series arrangement for which a series adapter may be utilized, there is no problem. It is simply necessary to terminate two of the wave ports of the adapter by wave one-ports corresponding to an inductance of impedance $R'\psi$ and a capacitance of impedance $R''/\psi$, respectively. If, however, the series resonant circuit has to be placed in a shunt branch, as is frequently the case, such a method of realization is not acceptable, since it would require directly connecting directly a series adapter to a shunt adapter.

This difficulty may be avoided by making use of the equivalence of a series resonant circuit with a cascade of two unit elements which are open-circuited at the output port 4, as shown in FIG. 40. The characteristic resistances $R_1$ and $R_2$ of these unit elements are related to R' and R'' by $$R_1 = R' + R'' \text{ and } R_2 = (R'+R'')R''/R' \quad (4.1a) \text{ and } (4.1b)$$

The waves $a_1$, $b_1$, $a_2$ and $b_2$ are defind for a port resistance $R_1$ while the waves $a_3$, $b_3$, $a_4$ and $b_4$ are defined for a port resistance $R_2$. Consequently, the wave flow diagram corresponding to FIG. 40 must utilize a two-port adapter for changing from $R_1$ to $R_2$. Hence, utilizing the results of FIGS. 10, 11, 19, 20, 28 and 29, and assuming that the waves $a_1$ and $b_1$ remain defined for a port resistance $R_1$, this wave flow diagram becomes as shown in FIG. 41. It thus requires only one multiplier, the corresponding parameter $\alpha$ being indicated by Equation (3.4), that is, due to Equations (4.1a) and (4.1b), by $$\alpha = (R'-R'')/(R'+R'') \quad (4.2)$$

The wave flow diagram of FIG. 41 may obviously be utilized not only for the realization of a shunt branch, but also in any series arrangement. It contains a feedback loop, but this does not make it unrealizable, since such loop comprises the delay T. Furthermore, any additional feedback loop created by connecting FIG. 41 to any other wave port is also acceptable, since it necessarily includes the two delays T/2.

Parallel Resonant Circuit

The problem of realizing a parallel resonant circuit is in a sense the dual of the aforedescribed problem. FIGS. 42, 43 and 44 are self-explanatory. The final conclusions are the same. Equations (4.1a) and (4.1b) have to be replaced by $$R_1 = R'R''/(R'+R'') \; R_2 = R''^2/(R'+R'') \quad (4.3)$$

although Equation (4.2) remains valid.

Arbitrary Reactances

As has been shown by Richards in "Resistor Transmission Line Circuits", Proc. IRE, Vol. 36, February, 1948, pages 217 to 220, any reactance of degree $n$ may be realized by means of either an open-circuited or a short-circuited cascade of $n$ unit elements. By generalizing the results of FIGS. 39, 40, 41 and 42, 43, 44 it is readily seen that a wave flow diagram corresponding to such a cascade can always be realized by means of $n-1$ two-port adapters, thus requiring $n-1$ multipliers. Such a wave flow diagram always contains $n-1$ feedback loops, all of which obey the rule in the section entitled "General Principles". Furthermore, it remains true that the input wave port may be freely connected to any further wave port without violating this rule.

Realization of Allpass Circuits

A unilateral first degree allpass section may always be realized by means of a three-port circulator and a capacitance or an inductance (Belevitch, "Classical Network Theory", Holden-Day, San Francisco, 1968). It is sufficient to consider the first of these cases, as shown in FIG. 45. The results of FIGS. 5, 6, 7, 17 and 18 are utilized to immediately obtain the corresponding wave two-port shown in FIG. 46. The wave two-port contains one two-port adapter, thus requiring one multiplier.

A unilateral second degree all pass section may be realized in a similar way by utilizing, for example, the result of FIGS. 39, 40 and 41. This leads to the result of FIGS. 47 and 48, wherein $R_1$ and $R_2$ are given by Equations (4.1a) and (4.1b). It is clear that the same procedure may be utilized for the realization of unilateral allpass sections of any degree by utilizing reactances of correspondingly higher degree. Finally, bilateral allpass sections may always be obtained by utilizing four-port rather than three-port circulators.

An allpass of arbitrary degree may also be obtained by cascading first and second degree sections. Since all individual sections must then have the same circulation resistance R, no adapters are required between these sections. Finally, if the allpass to be realized is unilateral, and if it is connected to a source having a resistance R and a load resistance also equal to R, the results of FIGS. 21, 22, 23, 8 and 9 indicated that no signal flows in the return path, so that it may simply be dropped. An example is shown in FIGS. 49 and 50, wherein $R_1$ and $R_2$ are still provided by Equations (4.1a) and (4.1b).

Realization of Filter Circuits

Figure 51:
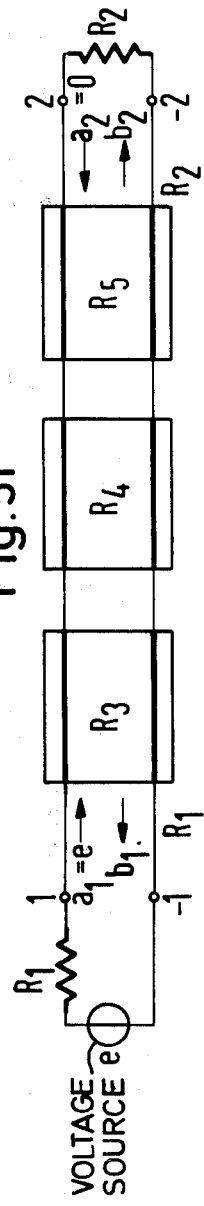
FIG. 51 is a circuit diagram of a filter comprising a cascade of three unit elements.
Figure 52:
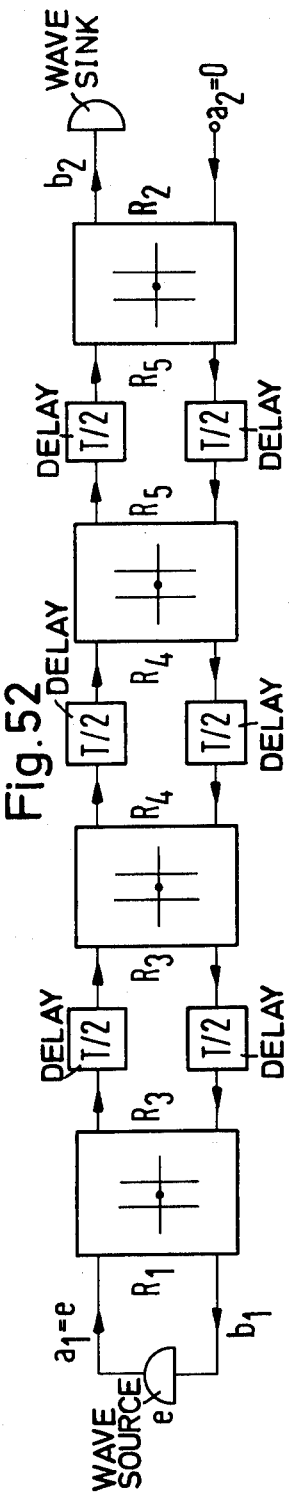
FIG. 52 is a wave flow diagram of FIG. 51.

It is known from the theory of microwave transmission line filters that it is always possible to build filters by cascading a specific number of unit elements with different characteristic impedances (Ozaki and Ishii, "Synthesis of Transmission Line Networks and the Design of UHF Filters", IRE Transactions, Circuit Theory, Vol. CT-2, December, 1955, pages 325 to 336). Such filters always lead to realizable wave flow diagrams. If $n$ is the number of unit elements, the number of multipliers required is n+1. An example is shown in FIGS. 51 and 52.

Figure 53:
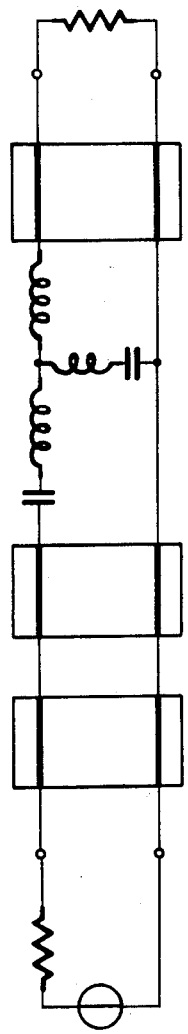
FIG. 53 is a circuit diagram of a bandpass filter comprising a reactance two-port in cascade with three unit elements.
Figure 54:
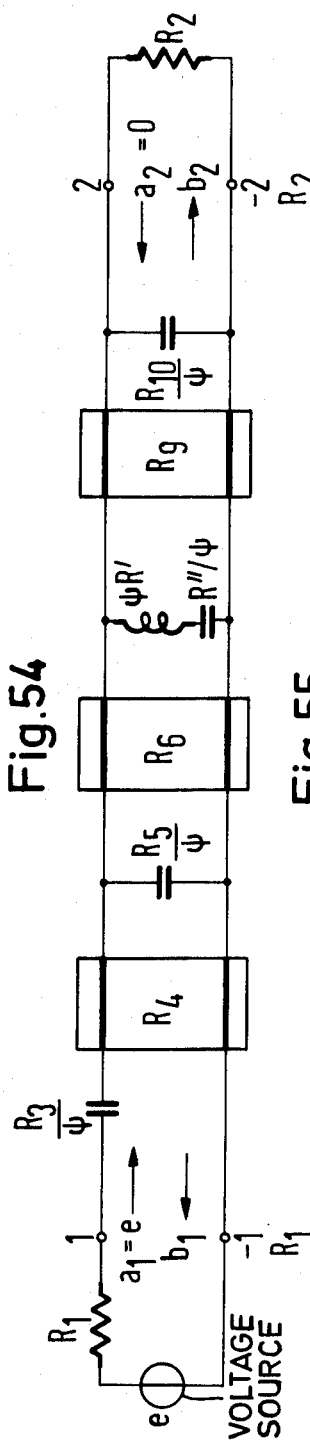
FIG. 54 is a circuit diagram of the unit element ladder structure of FIG. 53.
Figure 55:
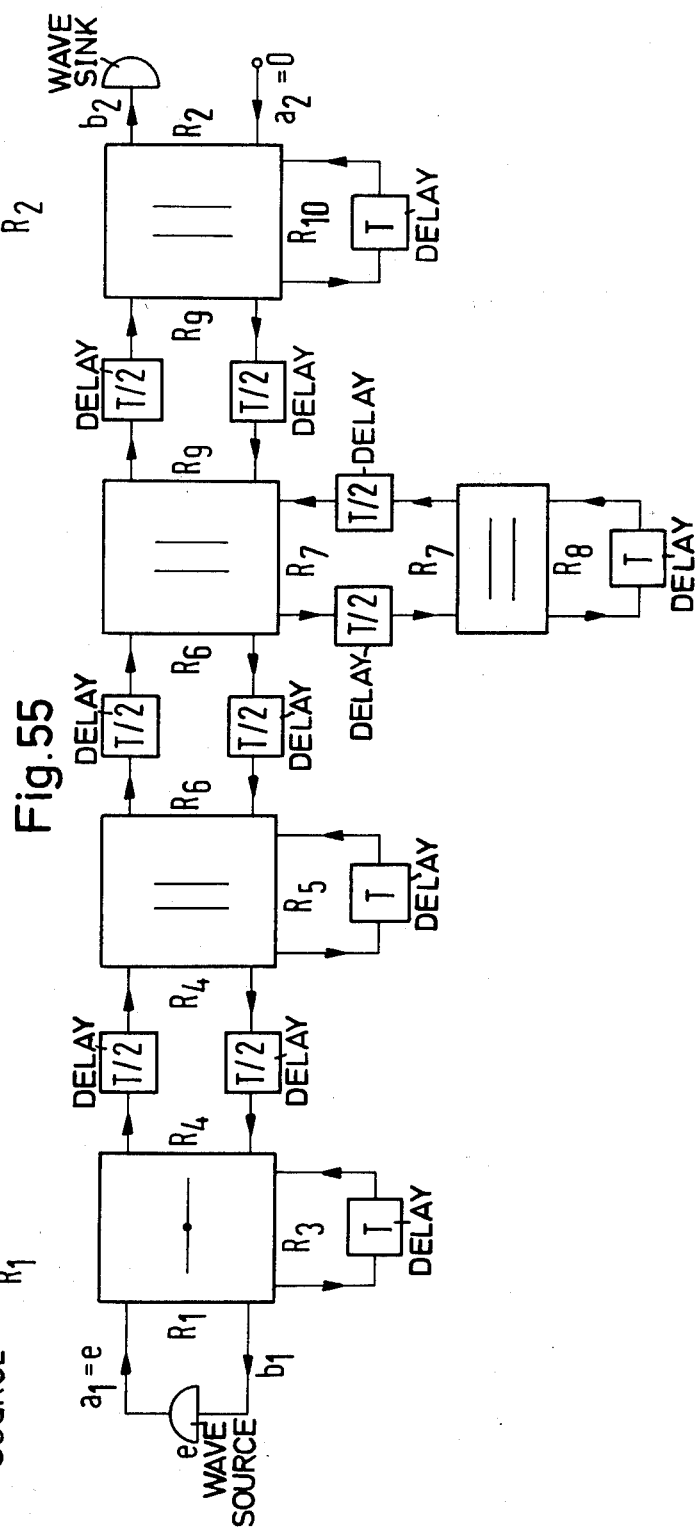
FIG. 55 is a wave flow diagram of FIG. 54.

Of particular interest in microwave theory are more general filters which may be derived from a reactance two-port in cascade with a sufficient number of unit elements. By utilizing the equivalence transformations of Fraiture and Neirynck, Ozaki and Ishii, Ikeno, Wenzel, Levy and Horton, such structures may be transformed into new cascade structures, hereinafter called unit element ladder structures, in which unit elements alternate with either series or shunt reactance arms. (Fraiture and Neirynck, "Theory of Unit Element Filters", Revue MBLE, Revue HF, Vol. VII, No. 12, 1969, pages 325 to 340; Ozaki and Ishii, "Synthesis of Transmission Line Networks and the Design of UHF Filters", IRE Transactions, Circuit Theory, Vol. CT-2, December, 1955, pages 325 to 336; Ikeno, "Principles of Designing Distributed Networks", Polytechnic Institute of Brooklyn, Report No. PIBMRI-1003-62, October, 1962; Wenzel, "Exact Design of TEM Microwave Networks Using Quarter-Wave Lines", IEEE Transactions, Microwave Theory and Techniques, Vol. MTT-12, January, 1964, pages 94 to 111; Levy, "A General Equivalent Circuit Transformation for Distributed Networks", IEEE Transactions, Circuit Theory, Vol. CT-12, September, 1955, pages 457 and 458; Horton and Wenzel, "Realization of Microwave Filters With Equal Ripple Response in Both Pass and Stop Bands", Proceedings of the Symposium on Generalized Networks, Polytechnic Press of the Polytechnic Institute of Brooklyn, Brooklyn, New York, 1966, pages 257 to 288). In fact, in microwave circuits, the primary interest for technological reasons is in that subclass of such structures in which only shunt reactance arms appear. For present purposes, however, no such restriction exists, since, as indicated in the preceding section, it is just as easy to imitate series connections as shunt connections. In other words, any unit element ladder structure leads to a realizable wave flow diagram. An example of a bandpass filter is shown in FIGS. 53, 54 and 55. $R_7$ and $R_8$ are indicated by equations similar to Equations (4.1a) and (4.1b).

The number of reactive elements is designated $m$ and the number of unit elements is designated $n$ in the unit element ladder structure. The number of multipliers required is then equal to $m+n+1$. The fact that one multiplier must be provided per unit element does not simply represent an expense for which no filtering effect is obtained. Rather, when designing the original filter, full use may be made of the filtering capabilities inherent in unit elements themselves (Fraiture and Neirynck, "Theory of Unit Element Filters", Revue MBLE, Revue HF, Vol. VII, No. 12, 1969, pages 325 to 340 and Fettweis, "Cascade Synthesis of Lossless Two-ports by Transfer Matrix Factorization", NATO Advanced Study Institute of Network Theory, Knokke, Belgium, 1969) (see FIGS. 51 and 52). The number $m+n+1$ is usually also equal to the number of independent coefficients in the transfer function or transmittance of the network. In this sense, it may be stated that the number of multipliers is canonic.

It is nowhere necessary to design first explicitly the first-mentioned structure from which the unit element ladder structure has been derived. In fact, the synthesis process may be conducted in a manner whereby the ladder structure is immediately obtained (aforedescribed Fraiture and Neirynck, and Fettweis articles).

Additional Comments

Since a unit element requires two delays T/2 while an inductance or a capacitance requires only one delay T, it may seem that a unit element is more expensive to realize. In fact, however, a delay T must always be realized by a tandem connection of two delays T/2 in order to permit an intermediate storage. This is necessary, since the writing and reading processes cannot be simultaneously undertaken at the same storage position. For a unit element, however, the writing and reading processes never coincide, since they are always at a time T/2 apart. A subdivision of the delay T/2 is thus not required. It may be concluded from this that for a digital filter having $m$ reactive elements and $n$ unit elements, the number of delays T/2, that is, the number of storage positions, which are required, is equal to $2(m+n)$.

The section "Interconnection of Ports" indicates that the resistances remain positive as long as $\alpha$, $\alpha_k$, and $\beta_k$ satisfy some quite uncritical conditions. Thus, except for extreme deviations of the multipliers, the circuit remains passive. More particularly, the circuit cannot normally become unstable, and its very low sensitivity to element variations hereinbefore discussed normally remains valid.

Thus far, it has always been assumed that the resistance parameters corresponding to the various elements are always positive. In fact, the various equations hereinbefore provided remain valid even if any number of these resistances are negative. In this case, the argument for guaranteeing the low passband sensitivity is no longer necessarily valid. It is also known, however, that in LC structures, in particular, in LC ladder structures, negative elements may appear which, when remaining within certain ranges, leave the overall structure passive. Inequalities such as $$-1 < \alpha < 1 \quad 0 < \alpha_k < 2 \quad 0 < \beta_k < 2$$

which were always valid before, do not have to hold anymore if some of the $R_k$ are negative, and the same is then obviously also true for conclusions derived from such inequalities.

Since a unit element requires one multiplier and two delays T/2, just like an inductance or a capacitance, its cost is essentially the same, too. It is well known, however, that the filtering capability of a cascaded unit element is less than that of a shunt or series reactive element. Thus, it may be of interest to economize the multiplier of a unit element without having to give up its delays, since these are necessary to make the wave flow diagram realizable. This goal may be achieved by forcing the characteristic resistance of the unit element to be equal to one of the other resistances belonging to an adjacent adapter. It has been hereinbefore described that such a procedure always permits the reduction of the number of multipliers which are required. It is true, of course, that this amounts to completely renouncing the filtering capabilities of the unit elements, but such a procedure may nevertheless well be economical. Furthermore, the classical filter design methods may then not be used anymore in a straightforward manner, since such methods, in practice, never by themselves furnish the required constraint. Some optimization technique thus must be used in the design process.

In addition to the aforedescribed elements, it is possible to realize quasi-reciprocal lines (Quarl's) and the related gyrating and circulating devices known from the resonant transfer theory (Fettweis, "Theory of Resonant-Transfer Circuits", published in "Networks and Switching Theory", edited by G. Biorci, Academic Press, New York, 1968, and Fettweis, "Theory of Resonant-Transfer Circuits and Their Application to the Realization of Frequency-Selective Networks", Proceedings of the Summer School on Circuit Theory, Czechoslovakian Academy of Sciences, Prague, 1968). It does not seem, however, that this would provide any advantage, since the gyrator and the circulators hereinbefore discussed offer even greater flexibility.

In order to realize a digital filter imitating an LC filter, the following procedure, which apparently is much simpler than the one hereinbefore described may be utilized. The start is from a given terminated lossless two-port comprising $m$ inductances and capacitances plus a certain number of frequency independent elements. If these inductances and capacitances, as well as the terminations are removed, a frequency independent $(m+2)$-port is left. The port resistance attributed to each port is the resistance of the corresponding element or source. The $m+2$ reflected waves are then expressed in terms of the $m+2$ incident waves. This determines an $(m+2)$-port adapter which in general is neither of the parallel nor the series type. Nevertheless, it does not contain any inner feedback loops, so that a realizable wave flow diagram is obtained by connecting to its wave ports the wave one-ports of the individual elements and the source. An obvious disadvantage, however, is the fact that the $(m+2)$-port adapter will in general require the large number of $(m+2)^2$ multipliers. Nevertheless, such a procedure may be used to synthesize certain smaller parts of a larger structure. In principle, the procedure could also be followed if the two-port also contains resistances, although is of little practical importance.

The hereinbefore discussed two-ports all concern filters which are resistively terminated at both ports. However, the same principles may be used to design digital filters imitating classical open-circuit or short-circuit filters.

Similarly to ordinary digital filters, wave digital filters may be transformed into corresponding digital N-path filters by simply adding a delay $(N-1)T$ to every delay T and a delay $(N-1)T/2$ to every delay T/2, while at the same time keeping the rate of operation of the filter at $F = 1/T$.

Claim Terminology

The symbol R has been used in the analog networks of FIGS. 2, 5, 8, 10, 12, 14a, 15, 17, 19, 21, 24, 26, 45 and 49; various of the symbols $R_0, R_1, R_2, \ldots R_n$ have been used in FIGS. 31, 33, 36, 40, 44, 45, 49, 51 and 54; and the symbols R', R" have been used in FIGS. 39, 42, 47, 49 and 54. These symbols have been described as positive constants herein and have been shown as being related to a resistance, inductance or capacitance component of an analog circuit in FIGS. 2, 5, 8, 21, 39, 42, 45, 47, 49, 51 and 54. (The symbol R is stated to refer to an arbitrary positive constant for the cases of FIGS. 10, 12 and 14a). The term "impedance-representing constants" is used in the claims to refer generically to the foregoing positive constants of the various analog networks.

The term "port element" will be used in the claims as generic to single-port elements such as those of FIGS. 3, 4, 6, 7, 9, 11, 13, 22, 23, 25 and 27; and to plural-port elements such as the two-port elements of FIGS. 14b, 16, 20 and 32, and the multiport elements of FIG. 18. As explained in the paragraph headed "Elements and Sources", whenever possible, the required wave quantities are defined by means of a port resistance equal to the constant R (here termed "impedance-representing constant") occurring in the definition of the element or source under consideration. See, however, equations (4.1a) and (4.1b).

As stated in the paragraph under the heading "Interconnection of Ports", in most cases the port resistance R (here termed "port impedance") is not arbitrary, but is imposed by the element or source to which the port belongs. Thus, when interconnecting ports, there must be available a possibility of changing the port impedance by means of various adaptors (here generally termed "interface device means").

The term "interface device" is herein utilized as generic to non-reactive two-ports such as shown in FIGS. 29 and 30, and non-reactive multiports such as shown in FIGS. 34, 35 and 37, 38.

A basic digital filter circuit such as shown in FIGS. 41; 43; 48; 50; 52; and 55 corresponds in its frequency-dependent transmission properties to an analog LC-network such as those of FIGS. 39 or 40; 42 or 44; 47; 49; 51; and 53 or 54; respectively.

In FIG. 41, for example, the time delays T/2 operate according to equations (2.23a) and (2.23b) and are each operable for receiving an input signal from an associated input terminal (such as $a_1$, FIG. 20), and for supplying an output signal to an associated output terminal (such as $b_2$, FIG. 20) at a discrete time thereafter in accordance with the time delay interval (T/2). The time delay interval is further discussed in the section hereof entitled "Additional Comments", from which it will be seen that the time delay interval is not limited to the product of one-half and the operating time interval (T). For example, a function (N −1) T/2 is also contemplated.

Also in FIG. 41 is shown a time delay T, and in FIG. 43 is shown a time delay T in series with an inverter. These components operate in accordance with equations (2.10) and (2.6) respectively, so that the time delay is operable for receiving an input signal from an associated input terminal (such as $a$, FIG. 4 or 7), and supplies an output signal to the associated output terminal (such as $b$, FIG. 4 or 7), at a discrete time thereafter in accordance with the time delay duration (T).

As shown by equations (3.4), (3.11a) and (3.11b), and (3.17), the multiplier coefficients in FIGS. 30, 35 and 38 are correlated with the port impedances assigned to the associated interface ports. The interface port impedances are matched to the port impedances of the connected port elements, and thus the multiplier coefficients are ultimately correlated with the impedance-representing constants which determine the port impedances of the port elements interchanging signals with the respective multipliers.

While the invention has been described by means of specific examples and in specific embodiments, I do not wish to be limited thereto, for obvious modifications will occur to those skilled in the art without departing from the spirit and scope of the invention.

I claim:

1. A filter for discrete signals,
   a. said filter comprising a filter circuit operating on discrete signals and having a filter function for discrete signals corresponding to the frequency-dependent transmission properties for electric analog signals of an analog ladder structure having a predetermined configuration of interconnected analog components including at least three reactive analog components with respective impedance-representing constants;
   b. said filter circuit for discrete signals having a plurality of port elements including ports each with a port input and a port output terminal, at least certain of said plurality of port elements corresponding in filter function to reactive analog components of the analog ladder structure and such certain port elements comprising time delay means interposed between port input and output terminals thereof, each time delay means providing a time delay which is a function of a given time interval and being operable for receiving an input signal from an associated input terminal at a discrete time and for supplying an output signal to an associated output terminal at a discrete time thereafter in accordance with said time delay; the ports of said port elements being assigned port impedance numbers in accordance with the impedance-representing constants of the analog ladder structure corresponding thereto, and
   c. said filter circuit comprising interface device means having interface ports connected with the ports of said port elements and interconnecting the port elements in accordance with the configuration of said analog ladder structure, and said interface ports including sets of interface ports connecting with sets of port elements corresponding to sets of connected analog components of the analog ladder structure;
   d. the interface device means having interface circuitry including adder means and multiplier means connected with each of the sets of interface ports for interchange of signals with ports of the port elements connected with such interface ports, each such multiplier means having a multiplier coefficient correlated with the port impedance numbers of the respective ports of said port elements interchanging signals therewith.

2. A filter as claimed in claim 1, with said filter circuit for discrete signals having time delay means to prevent time-delay-free feedback loops via the interface circuitry.

3. A filter as claimed in claim 1 with each set of interface ports having a connective relationship therebetween via the associated interface circuitry in accordance with a parallel, series-parallel or series connection of the set of connected analog components of the analog ladder structure corresponding to the port elements connected with such set of interface ports, and each multiplier means having a multiplier coefficient correlated in accordance with voltage or current waveflow relationships comprising $$a_k = v_k + R_k i_k \text{ and}$$

$$b_k = v_k - R_k i_k$$

where the values of $R_k$ for each set of interface ports are positive and equal to the port impedance numbers of the associated set of port elements; where the value of $v_k$ and $i_k$ for each set of interface ports have the same relationships as the voltages and currents of the set of connected analog components of the analog ladder structure corresponding to the associated set of port elements; and where $a_k$ and $b_k$ represent the values of the discrete input and output signals at the interface ports of each set.

4. A filter as claimed in claim 1, with said filter circuit for discrete signals having a time-delay-free one-port element terminating said filter circuit and comprising a wave sink for realizing a resistance termination of the analog ladder structure.

5. A filter as claimed in claim 1, with said filter circuit for discrete signals having a time-delay-free one-port element connected as input thereto and comprising a wave source for realizing a voltage source for connection as input to the analog ladder structure.

6. A filter for discrete signals,
   a. said filter comprising a filter circuit operating on discrete signals and having a filter function for discrete signals corresponding to the frequency-dependent transmission properties for electric analog signals of an analog filter structure having a predetermined configuration of interconnected analog components comprising at least three interconnected reactive analog components with respective impedance-representing constants;
   b. said filter circuit for discrete signals having a plurality of port elements including ports each with a port input and a port output terminal, at least three of said plurality of port elements comprising reactive port elements corresponding in filter function to respective reactive analog components of the analog filter structure and such reactive port elements comprising time delay means interposed between port input and output terminals thereof, each time delay means providing a time delay which is a function of a given time interval and being operable for receiving an input signal from an associated input terminal at a discrete time and for supplying an output signal to an associated output terminal at a discrete time thereafter in accordance with said time delay; the ports of said port elements being assigned port impedance numbers in accordance with the impedance-representing constants of the analog components corresponding thereto, and c. said filter circuit comprising interface device means having interface ports connected with the ports of said port elements and interconnecting the port elements in accordance with the configuration of said analog filter structure, and said interface ports effectively including at least three sets of interface ports connecting with sets of port elements corresponding to sets of connected analog components of the analog filter structure;

d. the interface device means having interface circuitry including adder means and multiplier means connected with each of the sets of interface ports for interchange of signals with ports of the port elements connected with such interface ports, each such multiplier means having a multiplier coefficient correlated with the port impedance numbers of the respective ports of said port elements interchanging signals therewith.

7. A filter as claimed in claim 6, with said filter circuit for discrete signals having means preventing time-delay-free feedback loops via the interface circuitry.

8. A filter as claimed in claim 6 with each set of interface ports having a connective relationship therebetween via the associated interface circuitry in accordance with the type of connection of the set of connected analog components of the analog filter structure corresponding to the port elements connected with such set of interface ports, and each multiplier means having a multiplier coefficient correlated in accordance with voltge or current wave-flow relationships comprising $a_k = v_k + R_k i_k$ and $b_k = v_k - R_k i_k$ where the values of $R_k$ for each set of interface ports are equal to the port impedance numbers of the associated set of port elements; where the values of $v_k$ and $i_k$ for each set of interface ports have the same relationship as the voltages and currents of the set of connected analog components of the analog filter structure corresponding to the associated set of the port elements; and where $a_k$ and $b_k$ represent the values of the discrete input and output signals at the interface ports of each set.

9. A filter as claimed in claim 6, with said filter circuit for discrete signals having a time-delay-free one-port element terminating said filter circuit and comprising a wave sink for realizing a resistance termination of the analog filter structure.

10. A filter as claimed in claim 6, with said filter circuit for discrete signals having a time-delay-free one-port element connected as input thereto and comprising a wave source for realizing a voltage source for connection as input to the analog filter structure.

11. A filter as claimed in claim 6, with said filter circuit having at least three series-coupled time-delay-free multiport elements providing for transmission of discrete signals between each reactive port element and other of said port elements, said multiport elements each having at least three ports with respective terminals, and coupling means coupling respective terminals of the respective ports in series such that a terminal of one port for supplying signals is connected to a terminal of a next port for receiving signals.

12. A filter as claimed in claim 6 with said filter circuit comprising at least three interconnected multiport elements each having at least three ports and each of said multiport elements having at least one of said reactive port elements connected thereto.

13. A filter as claimed in claim 12, with said multiport elements each having a common port impedance number assigned to each of the ports thereof, at least one of said reactive port elements being a one-port element having a different port impedance number from the common port impedance number of the associated multiport element and the interface device means coupling such reactive port element with the associated multiport element comprising an interface device with multiplier means correlated as to multiplier coefficient with said common port impedance number and with a port impedance number equal to the port impedance number of said one-port element.

* * * * *